United States Patent
Kim et al.

(10) Patent No.: US 12,068,046 B2
(45) Date of Patent: Aug. 20, 2024

(54) MEMORY DEVICE AND OPERATING METHOD THEREOF

(71) Applicant: SK hynix Inc., Gyeonggi-do (KR)

(72) Inventors: Jang Seob Kim, Gyeonggi-do (KR); Sang Ho Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 114 days.

(21) Appl. No.: 17/828,262

(22) Filed: May 31, 2022

(65) Prior Publication Data
US 2023/0178159 A1    Jun. 8, 2023

(30) Foreign Application Priority Data
Dec. 7, 2021    (KR) .......................... 10-2021-0173978

(51) Int. Cl.
*G11C 16/34* (2006.01)
*G11C 16/10* (2006.01)
*G11C 16/26* (2006.01)

(52) U.S. Cl.
CPC ........ *G11C 16/3459* (2013.01); *G11C 16/102* (2013.01); *G11C 16/26* (2013.01); *G11C 16/3404* (2013.01)

(58) Field of Classification Search
CPC ............................ G11C 16/3459; G11C 16/34
USPC .................................................. 365/185.22
See application file for complete search history.

(56) References Cited

U.S. PATENT DOCUMENTS

| | | | |
|---|---|---|---|
| 7,701,761 B2* | 4/2010 | Pan ......................... | G11C 16/08 365/185.21 |
| 7,808,819 B2* | 10/2010 | Murin ................ | G11C 16/0483 365/185.24 |
| 2014/0281770 A1* | 9/2014 | Kim ........................ | G11C 29/42 714/721 |
| 2019/0304550 A1* | 10/2019 | Shen ................... | G11C 16/3418 |
| 2019/0362794 A1* | 11/2019 | Oh .................... | G11C 29/50004 |
| 2020/0219571 A1 | 7/2020 | Chen et al. | |
| 2021/0065816 A1* | 3/2021 | Lee ......................... | G11C 29/44 |

FOREIGN PATENT DOCUMENTS

| | | |
|---|---|---|
| KR | 10-2020-0057827 A | 5/2020 |
| KR | 10-2131802 B1 | 7/2020 |
| KR | 10-2022-0077766 A | 6/2022 |

* cited by examiner

*Primary Examiner* — Muna A Techane
(74) *Attorney, Agent, or Firm* — IP & T GROUP LLP

(57) ABSTRACT

A storage device includes: a memory device including a plurality of memory cells, the memory device performing a read operation of reading data stored in selected memory cells among the plurality of memory cells; and a memory controller for receiving a read request from a host, and controlling the memory device to perform the read operation corresponding to the read request. The memory controller includes a read voltage inferrer for, when the read operation is completed, receiving read information on the read operation from the memory device, performing a read quality evaluation operation of evaluating the read operation based on the read information, and performing a read voltage inference operation of inferring a secondary read level corresponding to the read information according to a result of the performing the read quality evaluation operation.

19 Claims, 13 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2021-0173978, filed on Dec. 7, 2021, the entire disclosure of which is incorporated herein by reference.

BACKGROUND

1. Field of Invention

Embodiments of the present disclosure generally relate to a storage device, and more particularly, to a memory device and an operating method thereof.

2. Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a memory device for supporting an improved read operation and an operating method of the memory device.

In accordance with an embodiment of the present disclosure, there is provided a storage device including: a memory device including a plurality of memory cells, the memory device performing a read operation of reading data stored in selected memory cells among the plurality of memory cells; and a memory controller configured to receive a read request from a host, and control the memory device to perform a read operation corresponding to the read request, wherein the memory controller includes a read voltage inferrer configured to, when the read operation is completed, receive read information on the read operation from the memory device, perform a read quality evaluation operation of evaluating the read operation based on the read information, and perform a read voltage inference operation of inferring a secondary read level corresponding to the read information according to a result obtained by performing the read quality evaluation operation.

In accordance with another embodiment of the present disclosure, there is provided a method of operating a storage device including a memory device having a plurality of memory cells and a memory controller, the method including: performing a read operation of reading data stored in selected memory cells among the plurality of memory cells, when a read request is received from a host; performing a read quality evaluation operation of evaluating the read operation based on read information on the read operation when the read operation is completed; and performing a read voltage inference operation of inferring a secondary read level corresponding to the read information according to a result obtained by performing the read quality evaluation operation.

BRIEF DESCRIPTION OF THE DRAWINGS

Various embodiments of the present disclosure will be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
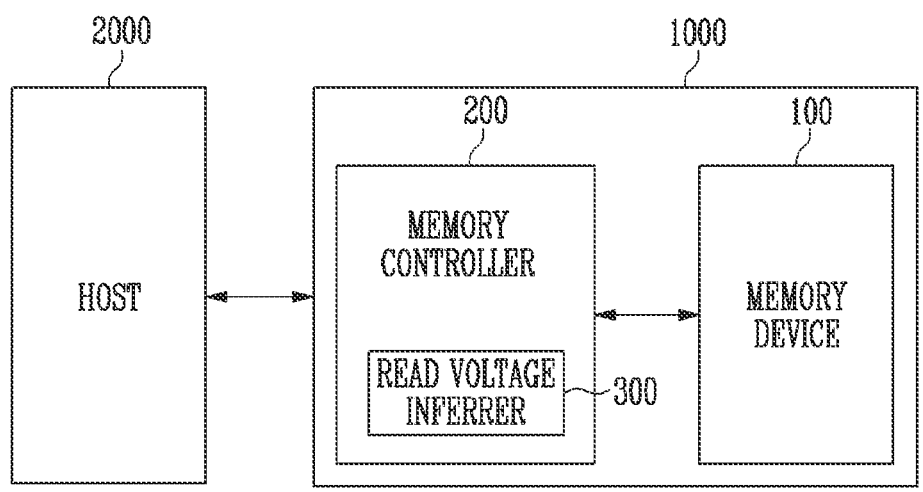
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 1000 may include a memory device 100 and a memory controller 200.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any of various types of storage devices according to a host interface that is a communication scheme with the host 2000. For example, the storage device 1000 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be implemented as any of various package types. For example, the storage device 1000 may be implemented as any various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command and an address from the memory controller 200. The memory device 100 may access an area selected by the received address in the memory cell array. That the memory device 100 accesses the selected area may mean that the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may mean an operation in which the memory device 100 reads data from the area selected by the address. The erase operation may mean an operation in which the memory device 100 erases data stored in the area selected by the address.

In accordance with an embodiment of the present disclosure, the memory device 100 may include a read history table. The memory device 100 may include the read history table including read information associated with a read voltage at which a read operation is performed. Also, when the read operation fails, the memory device 100 may retry the read operation by changing a level of the read voltage of the read operation which has failed under the control of the memory controller 200. The retried read operation may be performed with reference to the read history table. Also, after the read operation is re-performed, the memory device 100 may transmit a result of the retried read operation to the memory controller 200.

The memory controller 200 may control overall operations of the storage device 1000. Specifically, when power is applied to the storage device 1000, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells in which data included in the memory device 100 is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any request from the host 2000. For example, the memory controller 200 may control the memory device 100 to perform a program operation, a read operation, or an erase operation, which is used to perform a background operation such as wear leveling, garbage collection, or read reclaim.

In accordance with an embodiment of the present disclosure, the memory controller 200 may evaluate a quality of a read operation performed in the memory device 100. Specifically, the memory controller 200 may include a read voltage inferrer 300. The memory controller 200 may evaluate the quality of the read operation by using the read voltage inferrer 300. The memory controller 200 may receive information on a result of the read operation from the memory device 100. The memory controller 200 may evaluate whether a read voltage used in the read operation is appropriate by using the read voltage inferrer 300.

In accordance with an embodiment of the present disclosure, when the quality of the read operation is lower than a reference value, the memory controller 200 may infer an optimum read voltage used in the read operation by using the read voltage inferrer 300. The read voltage inferrer 300 may include an intelligent model learned by using machine learning. The read voltage inferrer 300 may infer the optimum read voltage used in the read operation by the intelligent model.

The host 2000 may communicate with the storage device 1000, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
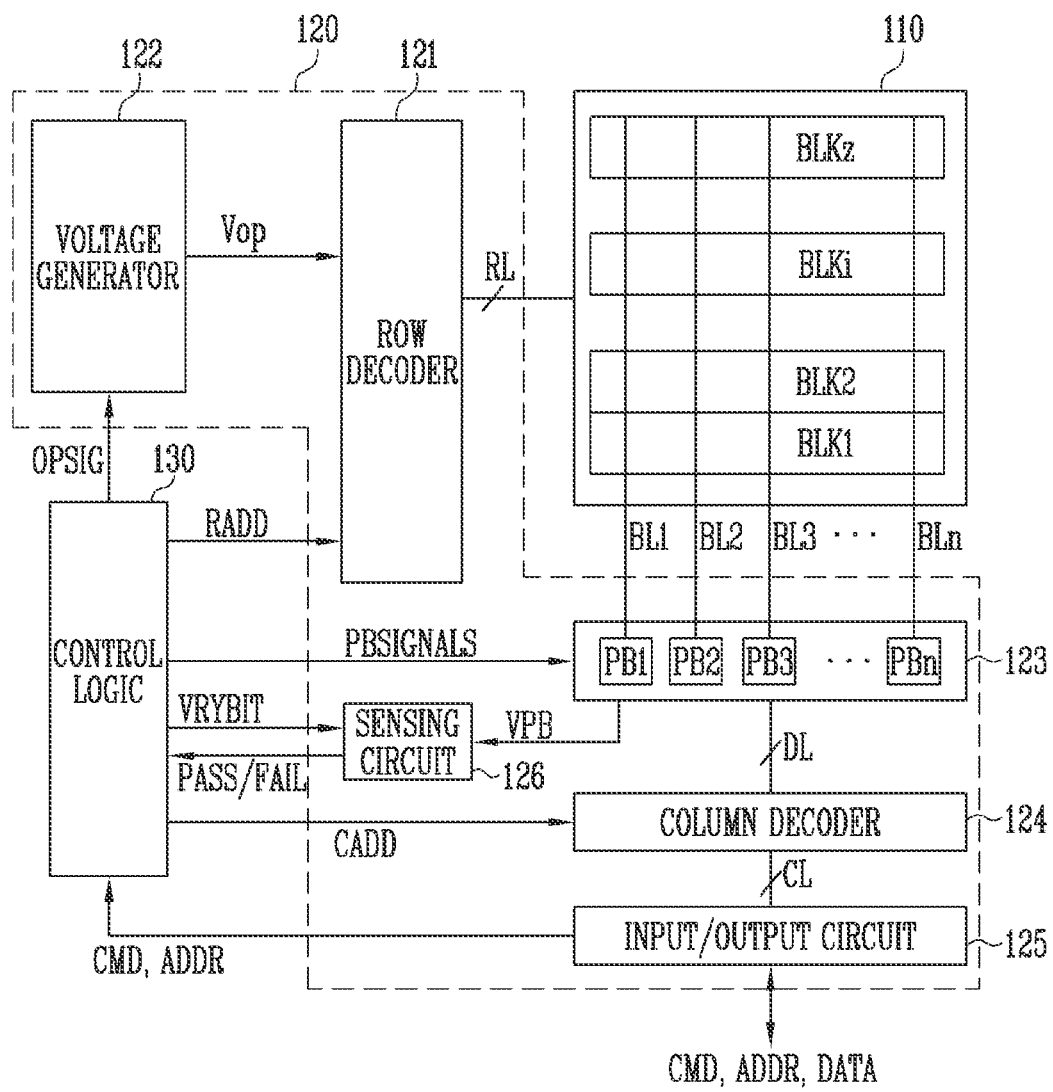
FIG. 2 is a diagram illustrating a memory device in accordance with an embodiment of the present disclosure.

FIG. 2 is a diagram illustrating a memory device in accordance with an embodiment of the present disclosure.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may be configured to perform a program operation, a read operation or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130. Specifically, the row decoder 121 may decode the row address RADD. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according to the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erase voltage, and the like under the control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or program verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage with respect to a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a pass PASS or a fail signal FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR.

Also, the control logic 130 may determine whether the verify operation has passed or failed in response to the pass or fail signal PASS or FAIL. The control logic 130 may control the page buffer group 123 to temporarily store verify information including the pass or fail signal PASS or FAIL in the page buffer group 123. Specifically, the control logic 130 may determine a program state of a memory cell in response to the pass or fail signal PASS or FAIL. For example, when the memory cell operates as a Triple Level Cell (TLC), the control logic 130 may determine whether the program state of the memory cell is one of an erase state E or first to seventh program states P1 to P7.

Figure 3:
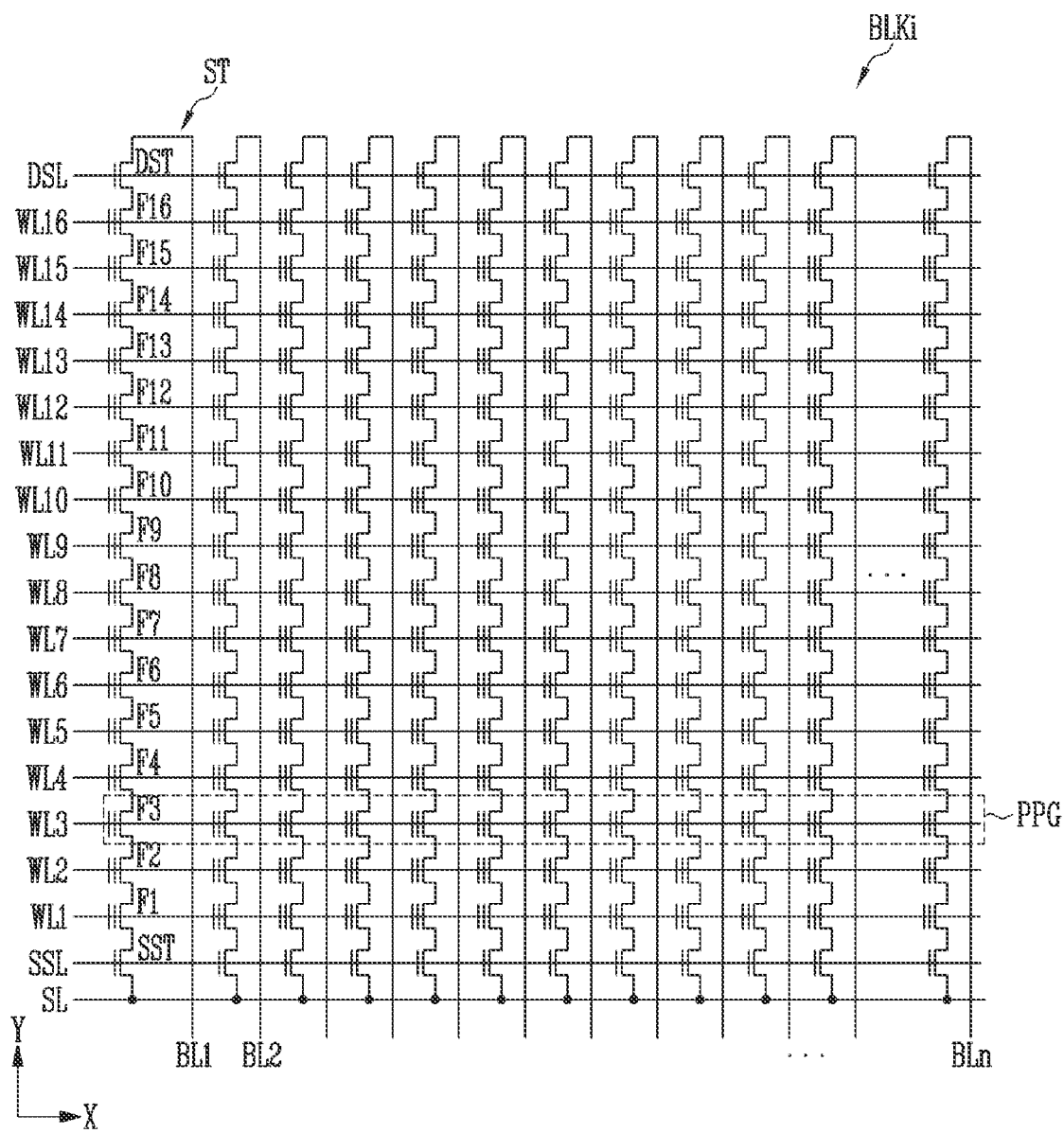
FIG. 3 is a diagram illustrating a memory block in accordance with an embodiment of the present disclosure.

FIG. 3 is a diagram illustrating a memory block in accordance with an embodiment of the present disclosure.

Referring to FIG. 3, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and a number of memory cells which is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells F1 to F16 may be connected to a plurality of word lines WL1 to WL16. A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The SLC may store one-bit data. One physical page PPG of the SLC may store one logical page (LPG) data. The one LPG data may include a number of data bits which correspond to the number of cells included in the one physical page PPG.

The MLC, the TLC, and the QLC may store two or more-bit data. One physical page PPG may store two or more LPG data.

Figure 4:
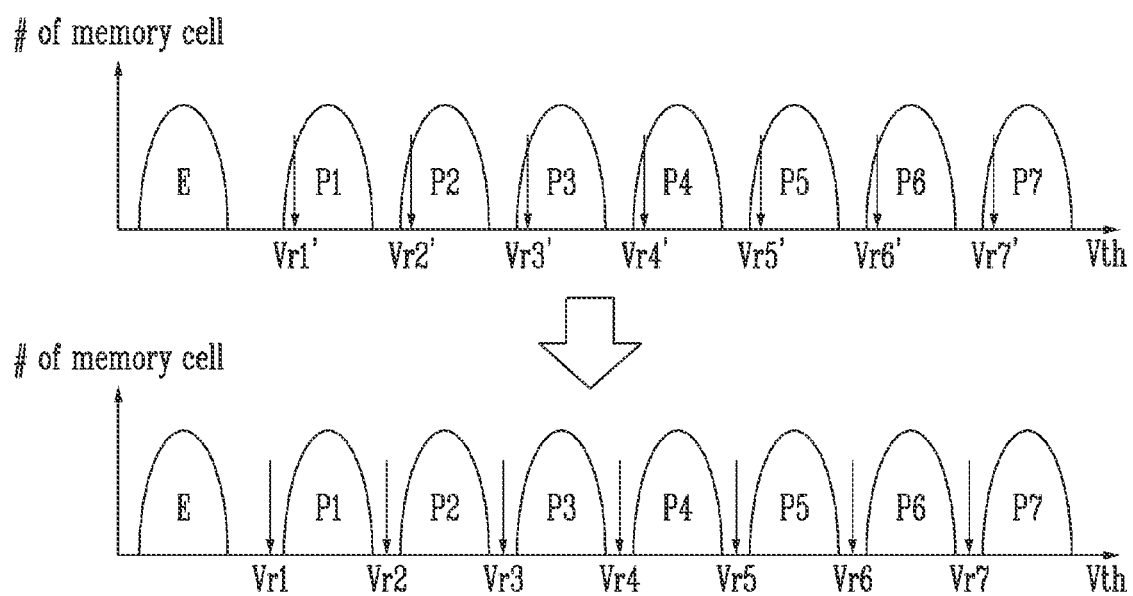
FIG. 4 is a diagram illustrating a read operation in accordance with an embodiment of the present disclosure.

FIG. 4 is a diagram illustrating a read operation in accordance with an embodiment of the present disclosure.

Referring to FIG. 4, a memory cell may be programmed to an erase state E or any of first to seventh program states P1 to P7 according to a threshold voltage. Although the memory cell shown in FIG. 4 is illustrated as a Triple Level Cell (TLC) which can be programmed to one erase state and seven program states, this is merely an embodiment for convenience of description. The memory cell may be implemented as a Multi-Level Cell (MLC), a Single Level Cell (SLC), a Quad Level Cell (QLC), or the like. In addition, for convenience of description, the erase state and the program states are distinguished from each other, but the erase state may be expressed as a zeroth program state P0. Therefore, the erase state E and the first to seventh program states P1 to P7, which are shown in FIG. 4, may be expressed as the zeroth to seventh program states.

Memory cells connected to a selected word line may have a threshold voltage included in the erase state E or one state among the first to seventh program states P1 to P7. That is, the memory cells may be programmed to have a threshold voltage included in the erase state E or one state among the first to seventh program states P1 to P7. The memory cells may be in the erase state E before a program operation is performed. In the program operation, the memory cells in the erase state E may be programmed to one program state among the seven program states, when a program voltage is applied to the selected word line.

In addition, the erase state E and the first to seventh program state P1 to P7 of memory cells may be distinguished from each other by using read voltages. The read operation may include a sensing operation of identifying whether each memory cell is an on-cell or off-cell by applying a read voltage to the memory cell and checking a state of current flowing according to the applied read voltage or a voltage of the memory cell. In the sensing operation, the storage device 1000 may set a read voltage, based on a threshold voltage value of memory cells, and identify whether the memory cells are on-cells or off-cells by using the set read voltage. Specifically, in the erase state E and the first program state P1, memory cells may be divided into on cells and off cells by a first read voltage Vr1. Similarly, in the second to seventh program states P2 to P7, memory cells may be divided into on cells and off cells by read voltages between the respective program states. That is, in the sensing operation, the storage device 1000 may identify whether the memory cell are on-cells or off-cells by setting the level of a read voltage to be higher than a maximum value of an on-cell distribution to be distinguished and setting the level of the read voltage to be lower than a minimum value of an off-cell distribution to be distinguished.

In addition, the read operation may include a decoding operation of identifying an on-distribution and an off-distribution of a plurality of memory cells and converting the identified distribution of the memory cells into data. Specifically, the storage device 1000 may identify a distribution of a specific memory cell by applying first to seventh read voltages Vr1 to Vr7 to the specific memory cell. For example, when the specific memory cell is programmed to the fourth program state P4, the specific memory cell may be sensed as an off-cell when the first to fourth read voltages are applied to the specific memory cell. The specific memory cell may be sensed as an on-cell when the fifth to seventh read voltages are applied to the specific memory cell. In addition, the storage device 1000 may identify that the specific memory cell has been programmed to the fourth program state P4 by combining the sensed results. The storage device 1000 may identify program states of a plurality of memory cells in the same manner, and convert a distribution of the memory cells into data by combining the identified program states.

Moreover, in the sensing operation, when a read voltage has a level at which program states of memory cells cannot be clearly distinguished from each other, a read fail may occur, in which a result of the read operation cannot be trusted. Specifically, when an applied voltage level is applied lower than the maximum value of the on-cell distribution or is applied higher than the minimum value of the off-cell distribution, the read fail may occur. For example, when the level of a read voltage for distinguishing the erase state E and the first program state P1 from each other is Vr1', some of the memory cells which operate as off-cells may operate as on-cells. Similarly, when one of the read voltages Vr2' to Vr7' for distinguishing the other program states (e.g., the second to seventh program states P2 to P7) from each other is set to an inappropriate level, an error may be included in read data.

In addition, in the decoding operation, the storage device 1000 may perform error correction decoding on erroneously read data. The storage device 1000 may correct the erroneously read data through the error correction decoding. For example, the storage device 1000 may perform the error correction decoding of correcting an error bit of data by using a parity bit generated in a low density parity check (LDPC) encoding process. However, when the number of error bits that occur is equal to or greater than a threshold number of error bits correctable through the error correction decoding, the storage device 1000 may determine that the read operation has failed.

The storage device 1000 may perform a read retry operation of retrying the read operation by changing a level of a read voltage when the read fail occurs. The storage device 1000 may determine a level of a read voltage at which the read operation passes by repeatedly performing the read retry operation. For example, the storage device 1000 may determine a level of the first read voltage as Vr1. Similarly, the storage device 1000 may determine levels of the second to seventh read voltages as Vr2 to Vr7.

Furthermore, the read operation or the read retry operation may be performed by using information of a predetermined read voltage or a read voltage stored in a read history table. Even when the read operation or the read retry operation passes, the read voltage used in the read operation or the read retry operation may not be a read voltage set to an optimum level. The storage device 1000 may evaluate a pre-performed read operation or a pre-performed read retry operation by using information of the read operation or the read retry operation, and update the information on the predetermined read voltage or the read voltage stored in the read history table.

Figure 5:
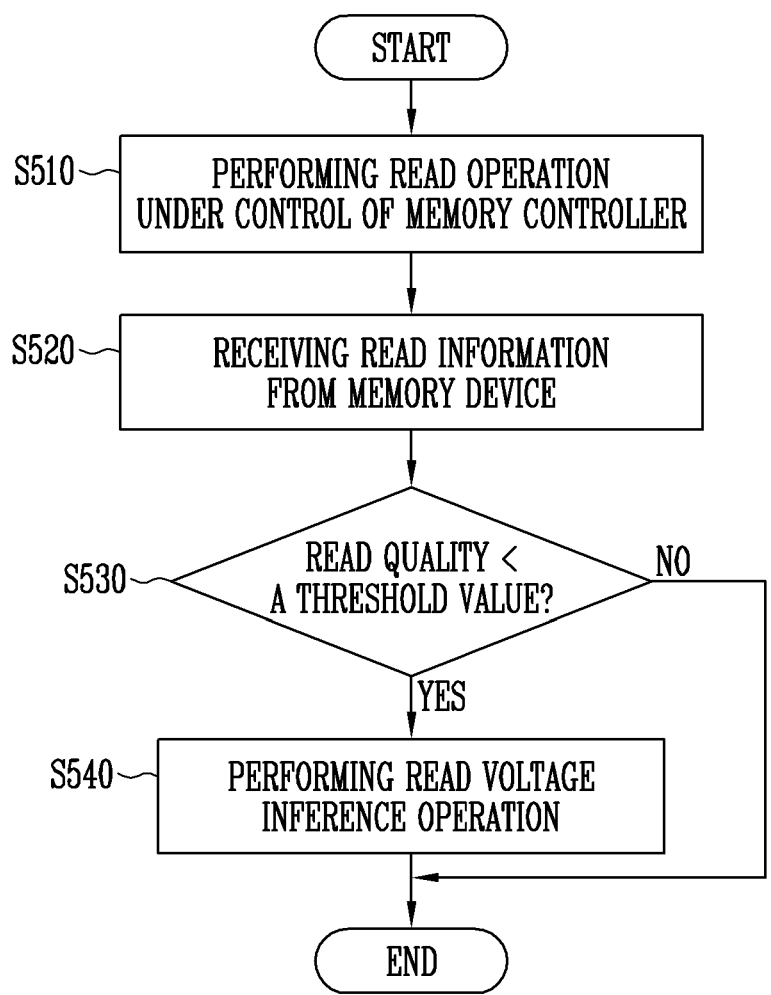
FIG. 5 is a diagram illustrating an operating method of the storage device in accordance with an embodiment of the present disclosure.

FIG. 5 is a diagram illustrating an operating method of the storage device in accordance with an embodiment of the present disclosure.

Referring to FIG. 5, the operating method of the storage device is sequentially illustrated. Specifically, the storage device 1000 may include a memory device 100 including a plurality of memory cells and a memory controller 200 which controls the memory device 100 to perform a read operation.

When the memory controller 200 receives a read request from the host 2000, the memory controller 200 may control the memory device 100 to perform a read operation of reading data stored in selected memory cells among the plurality of memory cells included in the memory device 100. That is, the memory device 100 may perform the read operation under the control of the memory controller 200 (S510).

Also, the memory controller 200 may receive read information from the memory device 100 (S520). The read information may be information obtained while the read operation is performed. Specifically, the read information may include read voltages used in the read operation, a physical address of memory cells on which the read operation is performed, a number of bits corrected in an error correction operation, a number of error bits for each program state, a number of all error bits occurring in the read operation, and the like. When the read operation is completed, the memory device 100 may transmit read information on the performed read operation to the memory controller 200, and the memory controller 200 may perform a read quality evaluation operation of evaluating the read operation, based on the read information received from the memory device 100. The read quality evaluation operation may be an operation of evaluating whether the read operation has been properly performed. Specifically, the read quality evaluation operation may be performed in a manner that compares the read information acquired in the read operation with a corresponding threshold value. For example, the read quality evaluation operation may be an operation of comparing a bit flip value representing a number of bits corrected in the read data with a first threshold value. Alternatively, the read quality evaluation operation may be an operation of comparing a number of error bits for each program state in the read data with a second threshold value. Alternatively, the read quality evaluation operation may be an operation of comparing a total number of error bits in the read data with a third threshold value. Alternatively, the read quality evaluation operation may be an operation of comparing a ratio of the total number of error bits in the read data to a tolerable number of error bits with a fourth threshold value.

Also, the memory controller 200 may perform a read voltage inference operation of inferring an optimum read level corresponding to the read information according to a result obtained by performing the read quality evaluation operation. Specifically, when read quality is smaller than a threshold value (S530—YES), the memory controller 200 may perform the read voltage inference operation (S540). The read quality may be a numerical value representing whether a read voltage level used in the performed read operation is appropriate. Also, the read quality may be calculated based on a bit flip value representing a number of bits corrected in the error correction decoding operation, a number of all error bits with respect to a number of error bits for each program state, or an error bit number with respect to an allow bit number. In addition, when the read quality is equal to or greater than the threshold value (S530—NO), the memory controller 200 may not perform the read voltage inference operation.

Figure 6:
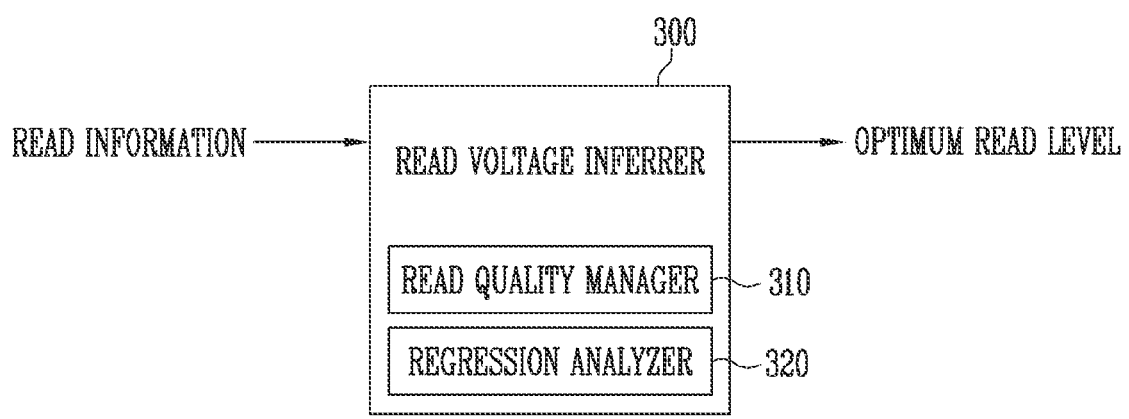
FIG. 6 is a diagram illustrating a read voltage inferrer in accordance with an embodiment of the present disclosure.

FIG. 6 is a diagram illustrating a read voltage inferrer 300 in accordance with an embodiment of the present disclosure.

Referring to FIG. 6, the read voltage inferrer 300 may include a read quality manager 310 and a regression analyzer 320. The read quality manager 310 and the regression analyzer 320 include all circuits, systems, software, firmware and devices necessary for their respective operations and functions.

The read quality manager 310 may perform a read quality evaluation operation of evaluating a read operation, based on read information on the read operation. Specifically, the read quality manager 310 may evaluate the read operation by using a bit flip value representing a number of bits corrected in an error correction decoding operation, a number of all error bits with respect to a number of error bits for each program state, an error bit number with respect to an allow bit number, or the like. Specifically, when the bit flip value representing the number of bits corrected in the error correction decoding operation is greater than a reference value, the read quality manager 310 may determine that the read operation is not appropriate. Also, when the bit flip value representing the number of bits corrected in the error correction decoding operation is smaller than the reference value, the read quality manager 310 may determine that the read operation has been appropriately performed. Also, the read quality manager 310 may determine whether the read operation has been appropriately performed, by using a ratio of a number of all error bits to a number of error bits for each program state. For example, when a number of error bits for a specific program state is greater than the number of all error bits, the read quality manager 310 may determine that the read operation has not been appropriately performed. Alternatively, the read quality manager 310 may evaluate the read operation by comparing an error bit number with an allow bit number. For example, when the error bit number is equal to the allow bit number, the read quality manager 310 may determine that the read operation has not been appropriately performed. That is, the read quality manager 310 may evaluate the read operation by using read information on the read operation and a reference value or threshold value, corresponding to each of the read information. The reference value or the threshold value, corresponding to each of the read information, may be determined through a repetitive experiment.

Also, the read quality manager 310 may compare read information on the read operation with the reference value or the threshold value, corresponding to each of the read information. That is, the read voltage inferrer 300 may check whether the read quality of the read operation performed using the read quality manager 310 has decreased to less than the reference value.

Also, when the read quality is decreased to less than the reference value, the read voltage inferrer 300 may infer an optimum read level by using the regression analyzer 320. That is, the regression analyzer 320 may output the optimum read level, based on the read information. The optimum read level is a read level output through the regression analyzer 320 included in the read voltage inferrer 300, and may be a secondary read level inferred by using the read information used in the read operation.

Specifically, the regression analyzer 320 may infer a peak voltage level corresponding to each program state, based on read voltage levels used in the read operation and sensing data (e.g., a number of '1s' or '0s') corresponding to each of the read voltage levels. Also, the regression analyzer 320 may infer threshold voltages with respect to selected memory cells by using the inferred peak voltage level. The regression analyzer 320 may output an optimum read level or a secondary read level by using the inferred threshold voltages.

The regression analyzer 320 may perform a linear regression analysis or training operation by using, as learning data, reference read voltage information which is a reference of a threshold voltage with respect to each program state, read voltage information stored in a read history table, and information on read voltage levels used in a previously performed read operation.

Figure 7:
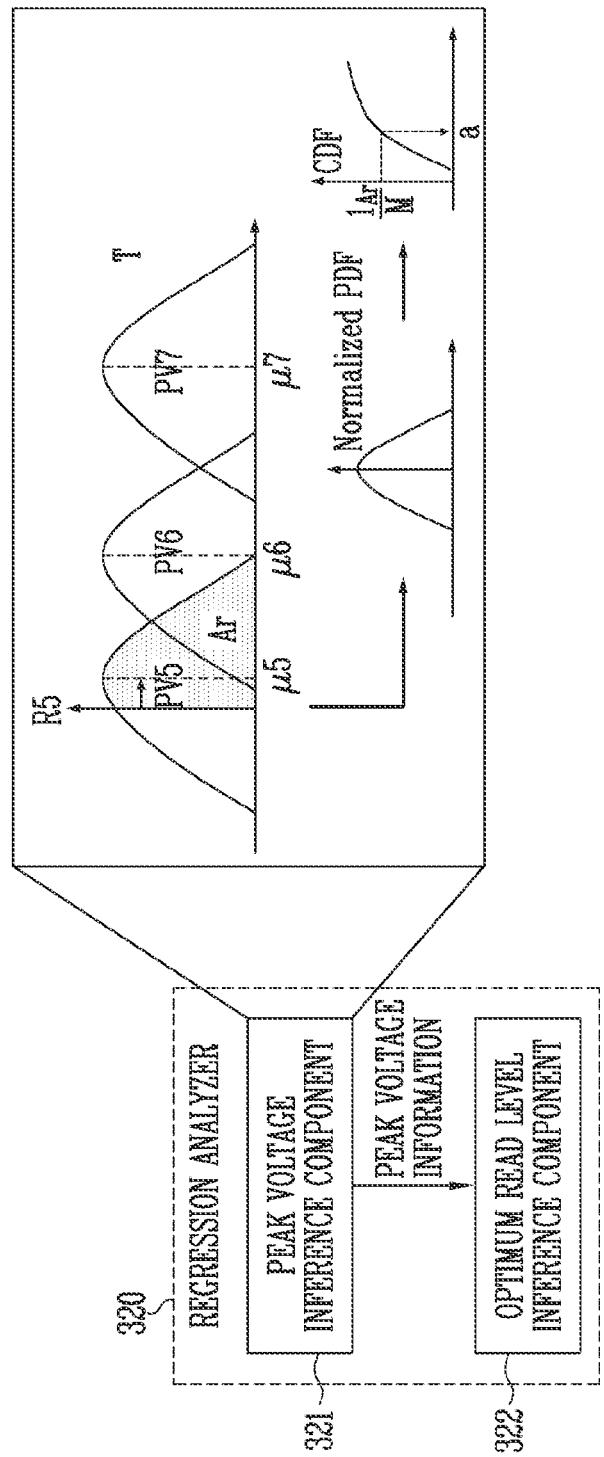
FIG. 7 is a diagram illustrating a method of inferring a peak voltage level in accordance with an embodiment of the present disclosure.

FIG. 7 is a diagram illustrating a method of inferring a peak voltage level in accordance with an embodiment of the present disclosure.

Referring to FIG. 7, the regression analyzer 320 may include a peak voltage inference component 321 and an optimum read level inference component 322. The peak voltage inference component 321 and the optimum read level inference component 322 include all circuits, systems, software, firmware and devices necessary for their respective operations and functions.

The regression analyzer 320 may include a machine learning based intelligent model. Also, the regression analyzer 320 is an inference system using a series of machine learning algorithms, and may perform a linear regression analysis by using, as learning data, information on threshold voltages with respect to a plurality of program states. In accordance with an embodiment of the present disclosure, the regression analyzer 320 may perform a linear regression analysis or a training operation by using, as learning data, reference read voltage information which is a reference of a program state of memory cells, read voltage information stored in a read history table, and information on read voltage levels used in a previously performed read operation. The training operation may mean an update process of minimizing an error or loss of a value actually output from the regression analyzer 320 and an output value calculated and yielded from an output layer.

The regression analyzer 320 may include a plurality of processors and may be implemented with the peak voltage inference component 321 which infers a peak voltage of selected memory cells by using some of the plurality of processors and the optimum read level inference component 322 which infers a level of an optimum read voltage of the selected memory cells.

The peak voltage inference component 321 may infer a peak voltage level corresponding to each program state of the selected memory cells. The peak voltage level may be a voltage level corresponding to an average of a voltage level of each program state.

Specifically, the peak voltage inference component 321 may use data sensed with respect to a specific read voltage to infer the peak voltage level. For example, the peak voltage inference component 321 may distinguish a number of on-cells and a number of off-cells with respect to a fifth read voltage R5 (illustrated in FIG. 7), and yield, as 11, the number of memory cells sensed as on-cells with respect to the fifth read voltage R5. In addition, when M memory cells are included for each program state of the selected memory cells, the following Equation 1 may be derived.

$$1_{A_r} = 1_T - 2M \qquad \text{Equation 1}$$

$1_{A_r}$ is a number of on-cells in a fifth program state PV5 corresponding to the read voltage R5, as illustrated in FIG. 7.

In addition, when the fifth program state PV5 follows a Gaussian distribution, the following Equation 2 may be derived.

$$Q\frac{R5 - \mu 5}{\sigma} * M = 1A_r \qquad \text{[Equation 2]}$$

In addition, when a cumulative distribution CDF is represented by using Equation 1 and Equation 2, the following Equation 3 may be derived.

$$\mu 5 = R5 - Q^{-1}\left(\frac{1Ar}{M}\right) * \sigma \qquad \text{[Equation 3]}$$

In Equation 3, µ5 is a peak voltage level of the fifth program state PV5.

The peak voltage inference component 321 may yield peak voltage levels of the other program states by using the same method, and peak voltage information on the peak voltage level yielded by the peak voltage inference component 321 may be transmitted to the optimum read level inference component 322.

Figure 8:
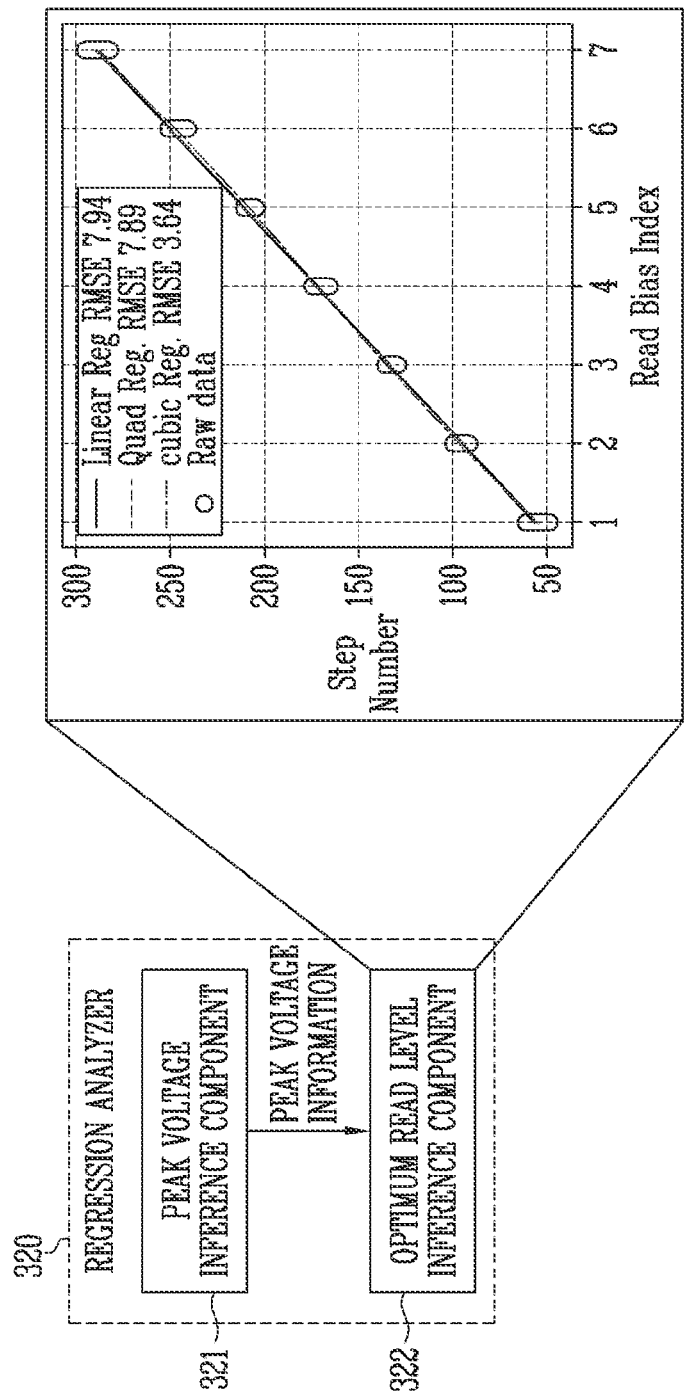
FIG. 8 is a diagram illustrating a method of yielding an optimum read level in accordance with an embodiment of the present disclosure.

FIG. 8 is a diagram illustrating a method of yielding an optimum read level in accordance with an embodiment of the present disclosure.

Referring to FIG. 8, the optimum read level inference component 322 may infer an optimum read level with respect to a read operation of selected memory cells by using peak voltage information received from peak voltage inference component 321.

Specifically, the optimum read level inference component 322 may perform an analysis according to linear regression. That is, the optimum read level inference component 322 may be an intelligent model learned based on a threshold voltage with respect to each program state. That is, the optimum read level inference component 322 may include a linear function derived based on a plurality of data about a read voltage.

In accordance with an embodiment of the present disclosure, the optimum read level inference component 322 may perform not only the analysis according to the linear regression but also a training operation, based on reference read voltage information, read voltage information stored in a read history table, and information on read voltage levels used in a previously performed read operation. The optimum read level inference component 322 may infer the optimum read level in the read operation on the selected memory cells by using the analysis according to the linear regression and the intelligent model learned using learning data. The training operation may mean an update process of minimizing an error or loss of an actually output value and an output value calculated and yielded from an output layer.

Figure 9:
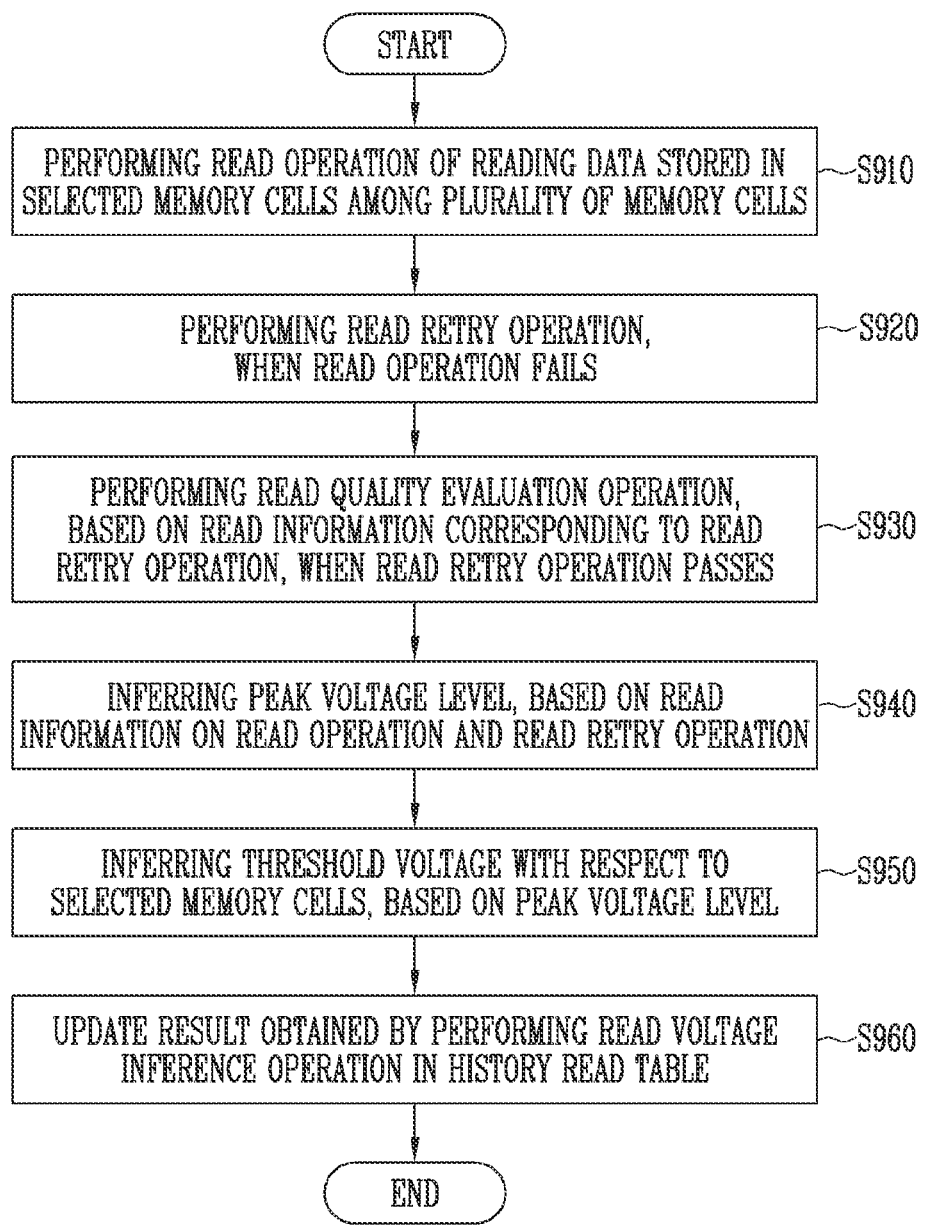
FIG. 9 is a diagram illustrating an operating method of the storage device in accordance with an embodiment of the present disclosure.

FIG. 9 is a diagram illustrating an operating method of the storage device in accordance with an embodiment of the present disclosure.

Referring to FIG. 9, the storage device 1000 may include a memory device including a plurality of memory cells and a memory controller.

Also, the storage device 1000 may perform a read operation of reading data stored in selected memory cells among the plurality of memory cells (S910). Specifically, the storage device 1000 may receive a read request for requesting data stored in the memory device 100 from the host 2000. When the storage device 1000 receives the read request from the host 2000, the storage device 1000 may perform the read operation of reading the data stored in the selected memory cells, corresponding to the read request.

Also, when the read operation fails, the storage device 1000 may perform a read retry operation of retrying the read operation, based on read voltage information stored in a read history table (S920). Moreover, when the read operation is completed, the storage device 1000 may perform a read quality evaluation operation of evaluating the read operation, based on read information on the read operation. The term 'completion of the read operation' may mean a case where the read operation passes or a case where the read operation fails in spite of read retry.

Also, when the read retry operation passes, the storage device 1000 may perform the read quality evaluation operation, based on read information corresponding to the read retry operation (S930). The read quality evaluation operation may mean an operation of comparing, with a corresponding threshold value, at least one of a bit flip value representing a number of bits corrected in an error correction decoding operation, a number of all error bits with respect to a number of error bits for each program state, and an error bit number with respect to an allow bit number. Also, when at least one of the bit flip value representing the number of bits corrected in the error correction decoding operation, the number of all error bits with respect to the number of error bits for each program state, and the error bit number with respect to the allow bit number is greater than the threshold value, the storage device 1000 may perform a read voltage inference operation. The read voltage inference operation may include an operation of inferring a peak voltage level corresponding to each program state and an operation of inferring a threshold voltage with respect to the selected memory cells, based on the peak voltage level.

Also, the storage device 1000 may perform a read voltage inference operation of inferring an optimum read level corresponding to the read information according to a result obtained by performing the read quality evaluation operation. Specifically, the storage device 1000 may infer a peak voltage level, based on the read operation. When the read retry operation passes after the read operation fails, the storage device 1000 may infer the peak voltage level, based on read information on the read operation and the read retry operation (S940). The read information may include read voltage levels used in the read operation and sensing data corresponding to each of the read voltage levels.

In addition, the storage device 1000 may infer a threshold voltage with respect to the selected memory cells, based on the peak voltage level (S950). Specifically, the storage device 1000 may perform a linear regression analysis or a training operation by using, as learning data, reference read voltage information which is a reference of a threshold voltage with respect to each program state, read voltage information stored in the read history table, and information on read voltage levels used in a previously performed read operation. The storage device 1000 may infer an optimum read level with respect to the selected memory cells by using the inferred threshold voltage.

Also, the storage device 1000 may update a result obtained by performing the read voltage inference operation in the read history table (S960). The read history table may be a table in which a level of a read voltage is stored for each memory block or for each word line. Also, when the read operation fails by using the read history table, the storage device 1000 may perform a read retry operation of retrying the read operation by changing the level of the read voltage. When the read retry operation passes, read information corresponding to the read retry operation may be used in the read quality evaluation operation. That is, the storage device 1000 may perform a read quality evaluation operation, based on read information corresponding to the read retry operation. In addition, when the read retry operation is performed, a read voltage inference operation may be performed based on the read information of the performed read operation and the read information of the read retry operation.

Figure 10:
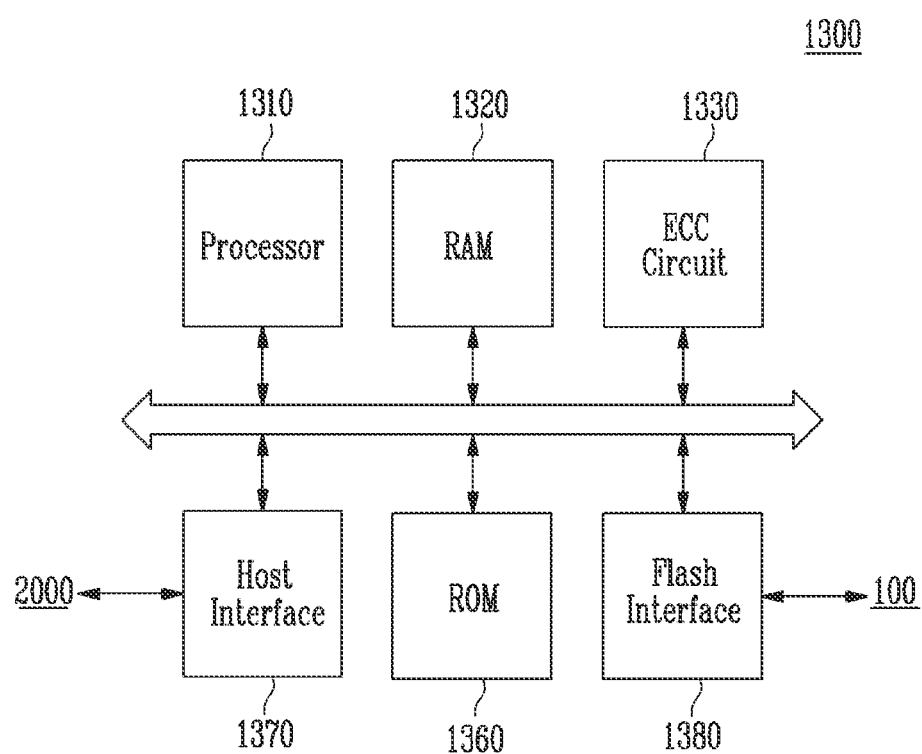
FIG. 10 is a diagram illustrating a memory controller in accordance with an embodiment of the present disclosure.

FIG. 10 is a diagram illustrating a memory controller in accordance with an embodiment of the present disclosure.

Referring to FIG. 10, the memory controller 1300 may include a processor 1310, a RAM 1320, and an ECC circuit 1330, a ROM 1360, a host interface 1370, and a flash interface 1380. The memory controller 1300 shown in FIG. 10 may be an embodiment of the memory controller 200 shown in FIG. 1.

The processor 1310 may communicate with the host 2000 by using the host interface 1370, and perform a logical operation to control an operation of the memory controller 1300. For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Flash Translation Layer (FTL). The processor 250 may translate a Logical Block Address (LBA) provided by the host 2000 into a Physical Block Address (PBA) through the FTL. The FTL may receive an LBA input by using a mapping table, to translate the LBA into a PBA. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as a buffer memory, a working memory, or a cache memory of the processor 1310. Also, the RAM 1320 may store codes and commands, which the processor 1310 executes. The RAM 1320 may store data processed by the processor 1310. Also, the RAM 1320 may be implemented, including a Static RAM (SRAM) or a Dynamic RAM (DRAM).

The ECC circuit 1330 may detect an error in a program operation or a read operation, and correct the detected error. Specifically, the ECC circuit 1330 may perform an error correction operation according to an Error Correction Code (ECC). Also, the ECC circuit 1330 may perform ECC encoding, based on data to be written to the memory device 100. The data on which the ECC encoding is performed may be transferred to the memory device 100 through the flash interface 1380. Also, the ECC circuit 1330 may perform ECC decoding on data received from the memory device 100 through the flash interface 1380.

The ROM 1360 may be used as a storage unit for storing various information necessary for an operation of the memory controller 1300. Specifically, the ROM 1360 may include a map table, and physical-to-logical address information and logical-to-physical address information may be stored in the map table. Also, the ROM 1360 may be controlled by the processor 1310.

The host interface 1370 may include a protocol for exchanging data between the host 2000 and the memory controller 1300. Specifically, the host interface 1370 may communicate with the host 2000 through at least one of various communication standards or interfaces such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 by using a communication protocol under the control of the processor 1310. Specifically, the flash interface 1380 may communicate a command, an address, and data with the memory device 100 through a channel. For example, the flash interface 1380 may include a NAND interface.

Figure 11:
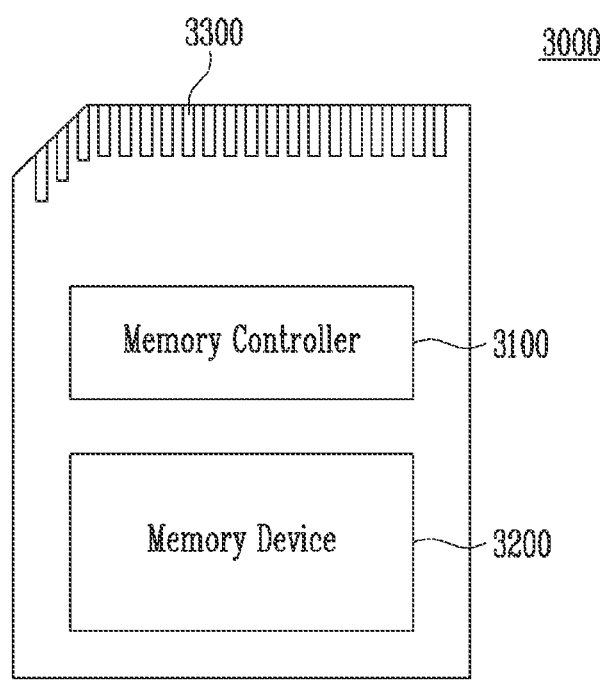
FIG. 11 is a diagram illustrating a memory card system in accordance with an embodiment of the present disclosure.

FIG. 11 is a diagram illustrating a memory card system in accordance with an embodiment of the present disclosure.

Referring to FIG. 11, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as a Random Access Memory (RAM), a processing unit, a host interface, a memory interface, and the error corrector.

The memory controller 3100 may communicate with an external device through the connector 3300. The memory controller 3100 may communicate with the external device (e.g., the host) according to a specific communication protocol. The memory controller 3100 may communicate with the external device through at least one of various communication standards or intgerfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 3200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 12:
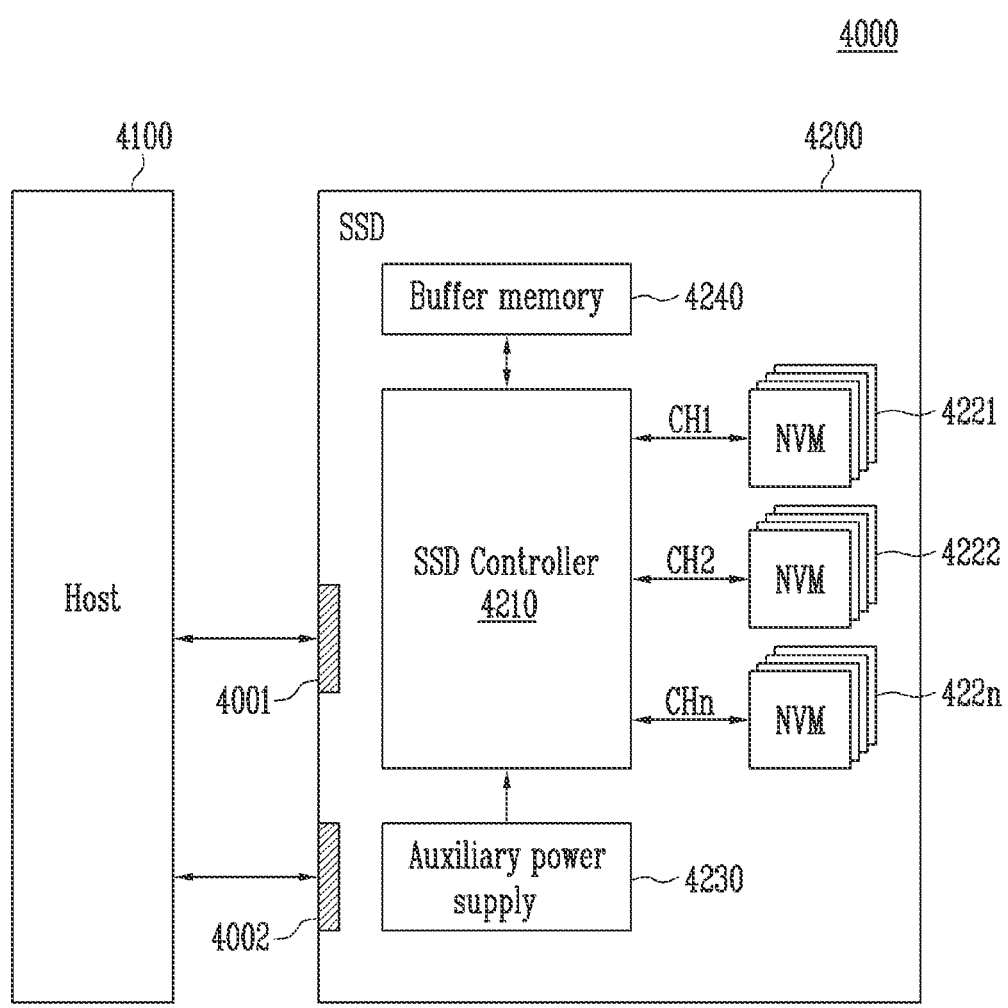
FIG. 12 is a diagram illustrating a Solid State Drive (SSD) in accordance with an embodiment of the present disclosure.

FIG. 12 is a diagram illustrating a Solid State Drive (SSD) in accordance with an embodiment of the present disclosure.

Referring to FIG. 12, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422n in response to a signal SIG received from the host 4100. The signal SIG may be a signal based on an interface between the host 4100 and the SSD 4200. For example, the signal SIG may be a signal defined by at least one of communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power to the SSD 4200. The auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 13:
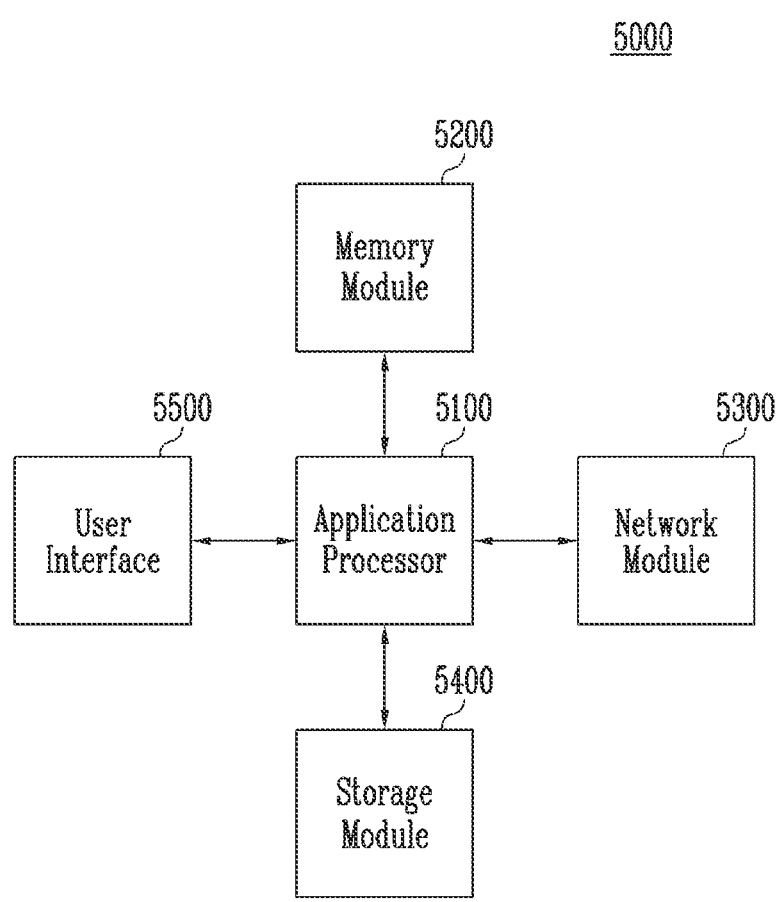
FIG. 13 is a diagram illustrating a user system in accordance with an embodiment of the present disclosure.

FIG. 13 is a diagram illustrating a user system in accordance with an embodiment of the present disclosure.

Referring to FIG. 13, the user system 5000 includes an application processor 5100, a memory module 5200, a network module 5300, a storage module 5400, and a user interface 5500.

The application processor 5100 may drive components included in the user system 5000, an operating system (OS), a user program, or the like. The application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 5100 and the memory module 5200 may be provided as one semiconductor package by being packaged based on a Package on Package (POP).

The network module 5300 may communicate with external devices. The network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 5300 may be included in the application processor 5100.

The storage module 5400 may store data. For example, the storage module 5400 may store data received from the application processor 5100. Alternatively, the storage module 5400 may transmit data stored therein to the application processor 5100. The storage module 5400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 5400 may be provided as a removable drive such as a memory card of the user system 5000 or an external drive.

The storage module 5400 may include a plurality of nonvolatile memory devices, and the plurality of nonvolatile memory devices may operate identically to the memory device 100 described with reference to FIGS. 1 to 4. The storage module 4400 may operate identically to the storage device 1000 described with reference to FIG. 1.

The user interface 5500 may include interfaces for inputting data or commands to the application processor 5100 or outputting data to an external device. The user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, there is provided a memory device for supporting an improved read operation and an operating method of the memory device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims.

What is claimed is:

1. A storage device comprising:
    a memory device including a plurality of memory cells, and configured to perform a read operation of reading data stored in selected memory cells among the plurality of memory cells; and
    a memory controller configured to receive a read request from a host and control the memory device to perform the read operation corresponding to the read request,
    wherein the memory controller includes a read voltage inferrer configured to:
    receive, when the read operation is completed, read information on the read operation from the memory device,
    perform a read quality evaluation operation of evaluating the read operation, based on the read information, and
    perform a read voltage inference operation of inferring a secondary read level corresponding to the read information according to a result of the performing the read quality evaluation operation, and
    wherein the read voltage inferrer infers a peak voltage level corresponding to each program state based on read voltage levels used in the read operation, and the secondary read level by using the inferred peak voltage level.

2. The storage device of claim 1, wherein the read information includes at least one of a bit flip value representing a number of bits corrected in an error correction operation, a number of error bits for each program state, a number of all error bits occurring in the read operation, and the read voltage levels used in the read operation.

3. The storage device of claim 2, wherein the read voltage inferrer performs the read quality evaluation operation by comparing the bit flip value with a first threshold value, comparing the number of error bits for each program state with a second threshold value, and comparing the number of all error bits with a third threshold value.

4. The storage device of claim 3, wherein the read voltage inferrer performs the read voltage inference operation when at least one threshold value among the first to third threshold values is smaller than a numerical value corresponding to the at least one threshold value.

5. The storage device of claim 1, wherein the read voltage inferrer performs the read voltage inference operation by:
    inferring the peak voltage level corresponding to each program state, based on the read voltage levels used in the read operation and sensing data corresponding to each of the read voltage levels, and
    inferring a threshold voltage with respect to the selected memory cells, based on the inferred peak voltage level.

6. The storage device of claim 5, wherein the read voltage inferrer infers the threshold voltage by performing a linear regression analysis or a training operation by using, as learning data, reference read voltage information which is a reference of the threshold voltage with respect to each program state, read voltage information stored in a read history table, and information on read voltage levels used in a previously performed read operation.

7. The storage device of claim 1, wherein
    the memory controller controls the memory device further to perform a read retry operation of retrying a read operation, based on read voltage information stored in a read history table, when the read operation fails, and
    wherein the read voltage inferrer performs the read quality evaluation operation, further based on read information on the read retry operation, when the read retry operation passes.

8. The storage device of claim 7, wherein the read voltage inferrer performs the read voltage inference operation of inferring the secondary read level further corresponding to the read information on the read retry operation.

9. The storage device of claim 1, wherein the memory controller is further configured to update the secondary read level in a read history table.

10. A method of operating a storage device including a memory device having a plurality of memory cells and a memory controller, the method comprising:
    performing a read operation of reading data stored in selected memory cells among the plurality of memory cells, when a read request is received from a host;
    performing a read quality evaluation operation of evaluating the read operation, based on read information from the read operation, when the read operation is completed; and
    performing a read voltage inference operation of inferring a secondary read level corresponding to the read information according to a result of the performing the read quality evaluation operation,
    wherein the performing of the read voltage inference operation includes:
    inferring a peak voltage level corresponding to each program state, based on read voltage levels used in the read operation; and
    inferring the secondary read level by using the inferred peak voltage level.

11. The method of claim 10, wherein the read information includes at least one of a bit flip value representing a number of bits corrected in an error correction operation, a number of error bits for each program state, a number of all error bits occurring in the read operation and the read voltage levels used in the read operation.

12. The method of claim 11, wherein the performing of the read quality evaluation operation includes comparing the bit flip value with a first threshold value, comparing the number of error bits for each program state with a second threshold value, and comparing the number of all error bits with a third threshold value.

13. The method of claim 12, wherein the read voltage inference operation is performed when at least one threshold value among the first to third threshold values is smaller than a numerical value corresponding to the at least one threshold value.

14. The method of claim 10, wherein the performing of the read voltage inference operation further includes:
 sensing data corresponding to each of the read voltage levels; and
 inferring a threshold voltage with respect to the selected memory cells, based on the inferred peak voltage level.

15. The method of claim 10, further comprising performing a linear regression analysis or a training operation by using, as learning data, reference read voltage information which is a reference of a threshold voltage with respect to each program state, read voltage information stored in a read history table, and information on read voltage levels used in a previously performed read operation.

16. The method of claim 10, further comprising performing a read retry operation of retrying a read operation, based on read voltage information stored in a read history table, when the read operation fails,
 wherein, in the performing the read quality evaluation operation, the read quality evaluation operation is performed based on read information corresponding to the read retry operation, when the read retry operation passes.

17. The method of claim 16, wherein, in the performing the read voltage inference operation, a read voltage inference operation of inferring the secondary read level, based on the read information and the read information corresponding to the read retry operation, is performed.

18. The method of claim 10, further comprising updating the secondary read level output as a result obtained by performing the read voltage inference operation in a read history table.

19. An operating method of a controller, the operating method comprising:
 controlling a memory device to read, with one or more selected ones of groups of read voltages, data from selected memory cells;
 inferring, when the read data falls in one or more of conditions, a peak threshold voltage level for each program state based on a number of on-cells according to a corresponding voltage of the one or more selected groups of read voltages among the selected memory cells;
 inferring, based on the inferred peak threshold voltage level, optimal read voltages for the selected memory cells through analysis according to linear regression or through a training operation; and
 reflecting the optimal read voltages into the groups of read voltages,
 wherein the conditions include:
 when a number of error-corrected bits in the read data is greater than a first threshold,
 when a number of error bits for each program state in the read data is greater than a second threshold,
 when a total number of error bits in the read data is greater than a third threshold, and when a ratio of the total number of error bits to a tolerable number of error bits is greater than a fourth threshold.

* * * * *